United States Patent
Heying et al.

(10) Patent No.: US 7,632,726 B2
(45) Date of Patent: Dec. 15, 2009

(54) METHOD FOR FABRICATING A NITRIDE FET INCLUDING PASSIVATION LAYERS

(75) Inventors: Benjamin Heying, Fullerton, CA (US);
Ioulia Smorchkova, Lakewood, CA (US); Vincent Gambin, Gardena, CA (US); Robert Coffie, Camarillo, CA (US)

(73) Assignee: Northrop Grumman Space & Mission Systems Corp., Los Angeles, CA (US)

( * ) Notice: Subject to any disclaimer, the term of this patent is extended or adjusted under 35 U.S.C. 154(b) by 0 days.

(21) Appl. No.: 11/952,537

(22) Filed: Dec. 7, 2007

(65) Prior Publication Data
US 2009/0148985 A1 Jun. 11, 2009

(51) Int. Cl.
*H01L 21/338* (2006.01)

(52) U.S. Cl. .............. 438/167; 257/251; 257/E21.05; 257/E21.051

(58) Field of Classification Search .......... 438/167, 438/172, 135, 142, 197; 257/194, 251, E21.05, 257/E21.051, E21.4
See application file for complete search history.

(56) References Cited

U.S. PATENT DOCUMENTS

| | | | |
|---|---|---|---|
| 6,657,267 B1 | 12/2003 | Xiang et al. | |
| 7,045,404 B2 | 5/2006 | Sheppard et al. | |
| 2006/0255366 A1 | 11/2006 | Sheppard et al. | |
| 2007/0018210 A1* | 1/2007 | Sheppard | 257/289 |
| 2007/0241419 A1* | 10/2007 | Green et al. | 257/499 |

OTHER PUBLICATIONS

Heying, Benjamin, Smorchkova, Ioulia, Gambin, Vincent and Coffie, Robert, U.S. Utility Patent Application entitled "Protective Layer in Fabrication Device", U.S. Appl. No. 11/708,779, filed Feb. 21, 2007.

* cited by examiner

*Primary Examiner*—Quoc D Hoang
(74) *Attorney, Agent, or Firm*—John A. Miller; Miller IP Group, PLC

(57) ABSTRACT

A method for fabricating a nitride-based FET device that provides reduced electron trapping and gate current leakage. The fabrication method provides a device that includes a relatively thick passivation layer to reduce traps caused by device processing and a thin passivation layer below the gate terminal to reduce gate current leakage. Semiconductor device layers are deposited on a substrate. A plurality of passivation layers are deposited on the semiconductor device layers, where at least two of the layers are made of a different dielectric material to provide an etch stop. One or more of the passivation layers can be removed using the interfaces between the layers as an etch stop so that the distance between the gate terminal and the semiconductor device layers can be tightly controlled, where the distance can be made very thin to increase device performance and reduce gate current leakage.

24 Claims, 4 Drawing Sheets

METHOD FOR FABRICATING A NITRIDE FET INCLUDING PASSIVATION LAYERS

GOVERNMENT CONTRACT

This invention was made with Government support under Contract No. N00014-05-C-0121 awarded by the Office of Naval Research. The Government may have certain rights in this invention.

BACKGROUND OF THE INVENTION

1. Field of the Invention

This invention relates generally to a method for fabricating a nitride-based field effect transistor (FET) device employing a plurality of dielectric passivation layers and, more particularly, to a method for fabricating a nitride-based FET device including at least two dielectric passivation layers deposited on semiconductor device layers, where two of the passivation layers are made of different materials so that an interface between the layers acts as an etch stop to accurately control the distance between a gate terminal and the semiconductor device layers.

2. Discussion of the Related Art

Due to the wide bandgap and high carrier saturation velocity, nitride-based FET devices are ideal for high frequency and high power applications. However, these devices have had limited performance because they can suffer from electron trapping near the device surface and high gate terminal current leakage.

Dispersion or current collapse caused by electrons trapped at the surface of the semiconductor device near the gate terminal edge reduces the achievable power performance of nitride-based FET devices. In addition, under high bias conditions the high electric fields near the gate terminal edge during device operation can cause trap formation and increases dispersion during device operation leading to premature degradation of the power performance. One widely accepted model for dispersion is that electrons injected into trap states near the gate terminal form an extended virtual gate near the gate terminal edge extending the depletion region of the device channel. Since the response of the depletion region relies on electrons being removed from trap states, the device will not respond as fast as the depletion region under the gate terminal. This effectively results in reduced power of the device under high frequency operation.

It has been reported in the literature that device dispersion can be reduced by depositing a dielectric passivation layer, such as silicon nitride (SiN), over the device after ohmic and gate contacts have been formed. Typically, without the passivation layer deposited in the access regions between the source and gate contacts and the gate and drain contacts, devices can experience nearly total current collapse or 100% dispersion. Studies have shown that dispersion can be reduced by optimization of the surface preparation before passivation layer deposition and by the quality of the passivation deposition itself. Other studies have shown that by using a SiN first process where SiN is deposited before fabrication process, the dispersion can be reduced compared to depositing the SiN after the gate and ohmic contacts have been formed. The improvement in performance has been attributed to the protection the passivation layer in the SiN first process affords the surface during device fabrication. Furthermore, other studies have shown that utilizing a SiN first process where the SiN is deposited in-situ without exposing the semiconductor layers to the air environment nearly eliminates dispersion completely. This body of evidence indicates that traps effecting dispersion occur at or near the surface of the access region of the device. This evidence also indicates that processing steps, such as ohmic anneals, plasma cleans, etc., can induce traps in the unprotected device surface.

High gate leakage current reduces power performance and can lead to premature failure an FET device. Nitride-based FET devices typically suffer from high gate leakage due to extended defects in a barrier layer of the device or traps along the surface of the FET device.

Some prior art nitride-based FET devices have utilized a MISFET type structure where a thin dielectric layer is left under the gate terminal to reduce gate current leakage problems. The dielectric layer increases the barrier to tunneling and reduces the gate current leakage. In addition it has been shown that utilizing a thin SiN dielectric layer under the gate terminal can improve reliability of the device and drastically improve the gate current stability of the device.

SUMMARY OF THE INVENTION

In accordance with the teachings of the present invention, a method for fabricating a nitride-based FET device is disclosed that provides reduced electron trapping and gate current leakage. The fabrication method provides a device that includes a relatively thick passivation layer in the access regions of the device to reduce traps caused by device processing and a thin passivation layer below the gate terminal to reduce gate current leakage. Semiconductor device layers are deposited on a substrate. A plurality of passivation layers are deposited on the semiconductor device layers, where at least two of the layers are made of a different dielectric material to provide an etch stop. The passivation layers may be fully or partially removed in the areas of the device designated for source and drain terminals so that the source and drain terminals can be formed directly on the semiconductor device layers. The passivation layers may be left intact or may be partially removed in the area of the device designated for a gate terminal. One or more of the passivation layers can be removed using the interfaces between the layers as an etch stop so that the distance between the gate terminal and the semiconductor device layers can be tightly controlled, where the distance can be made very thin so that device performance is not severely impacted, but sufficiently thick to reduce gate current leakage.

In one embodiment, the passivation layers are deposited before the semiconductor layers are exposed to air and before the source terminal, the drain terminal and the gate terminal are deposited. In another embodiment, the passivation layers are deposited after the semiconductor layers have exposed to air, but before the source terminal, the drain terminal and the gate terminal are deposited.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method for fabricating an FET device including passivation layers where one of the passivation layers acts as an etch stop for a gate terminal of the device is merely exemplary in nature, and is in no way intended to limit the invention or its applications or uses. For example, the present invention is applicable for many different types of FET and other semiconductor devices as will be appreciated by those skilled in the art.

Figure 1:
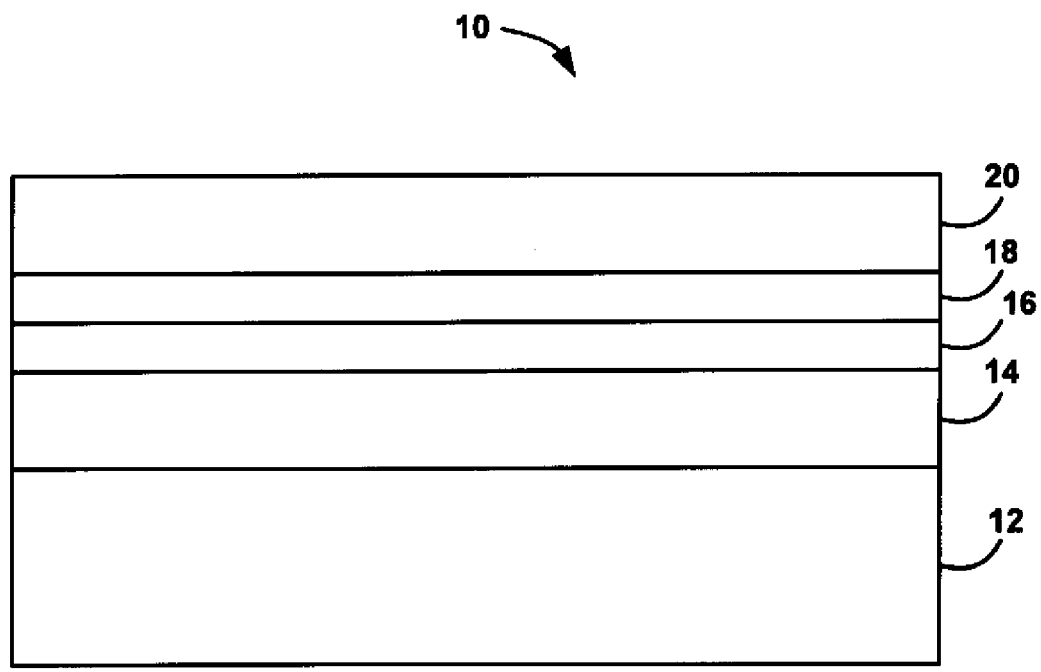
FIG. 1 is a cross-sectional view of a semiconductor device profile employing passivation layers, according to an embodiment of the present invention.

FIG. 1 is a cross-sectional view of the material profile of a semiconductor device 10, according to an embodiment of the present invention. FIG. 1 is intended to show a partial fabrication step of the device 10, where the device 10 can be any suitable nitride-based field effect transistor (FET) device, such as high electron mobility transistor (HEMT) devices, metal semiconductor field effect transistor (MESFET) devices, metal oxide field effect transistor (MOSFET) devices, metal insulator field effect transistor (MISFET) devices, modulation doped field effect transistor (MODFET) devices, etc. The device 10 includes a substrate 12 made of any suitable material for a nitride-based FET device, which is typically sapphire, SiC, Si, AlN or GaN. Semiconductor device layers 14 are deposited on the substrate 12. The device layers 14 are intended to represent device layers for any of the FET devices mentioned above, and depending on the particular device, can be one or more of buffer layers, nucleation layers, channel layers, barrier layers, cap layers, etc., all of which are well understood to those skilled in the art.

According to the invention, at least two dielectric passivation layers made of different materials are deposited on the device layers 14. In the non-limiting embodiment shown in FIG. 1, the passivation layers include a first passivation layer 16 deposited on the device layers 14, a second passivation layer 18 deposited on the first passivation layer 16, and a third passivation layer 20 deposited on the second passivation layer 18. The passivation layers 16, 18 and 20 are intended to be protective layers that protect the semiconductor device layers 14 from exposure to surface damage during the device fabrication process, which may include plasma etches, chemical cleans, high-temperature anneals, etc., so that damage to the device layers 14 does not occur that could affect device performance. According to the invention, any suitable process can be used to deposit the layers 14, 16, 18 and 20 on the substrate 12, such as molecular beam epitaxy (MBE) processes, chemical vapor deposition (CVD) processes, physical vapor deposition (PVD) processes, atomic layer deposition (ALD) processes, or any suitable deposition process for nitride-based FET devices.

Also, according to the invention, all of the layers 14, 16, 18 and 20 can be deposited on the substrate 12 as a continuous process so that the semiconductor device layers 14 are not exposed to air, or any other damaging fabrication steps. However, in an alternate embodiment, the layers 16, 18 and 20 are deposited on the substrate 12 after the device layers 14 have been exposed to air. In either of these two processes, the dielectric layers 14, 16, 18 and 20 are deposited prior to source, drain or gate terminals being formed.

In one non-limiting embodiment, the first passivation layer 16 is a thin dielectric layer, such as silicon nitride (SiN). Typically, the thickness of the first passivation layer 16 will be in the range of 5-150 Å, but the layer 16 can have a greater thickness in certain embodiments, such as 5-300 Å. The second passivation layer 18 is also a thin dielectric layer, but is made of a different dielectric material, such as aluminum nitride (AlN), than the first passivation layer 16. The thickness of the layer 18 is typically in the range of 10-250 Å. As will be discussed in detail below, the interface between the first passivation layer 16 and the second passivation layer 18 operates as an etch stop, where a suitable wet or dry etchant that will dissolve the material of the second passivation layer 18, but will not dissolve the material of the first passivation layer 16 so that the distance between the semiconductor device layers 14 and a gate terminal can be tightly controlled.

The third passivation layer 20 is a relatively thick layer, typically in the range of 10-1000 Å, and can be made of a dielectric material that is the same as the second passivation layer 18 or different than the second passivation layer 18 depending on whether the interface between the second passivation layer 18 and the third passivation layer 20 needs to operate as an etch stop for gate terminal distance control. The third passivation layer 20 is made relatively thick so that the distance between the top of the third passivation layer 20 and the top of the device structure layers 14 is large enough so that processing steps after the passivation layers 16, 18 and 20 have been deposited will not damage the device layers 14 creating traps.

Figure 2:
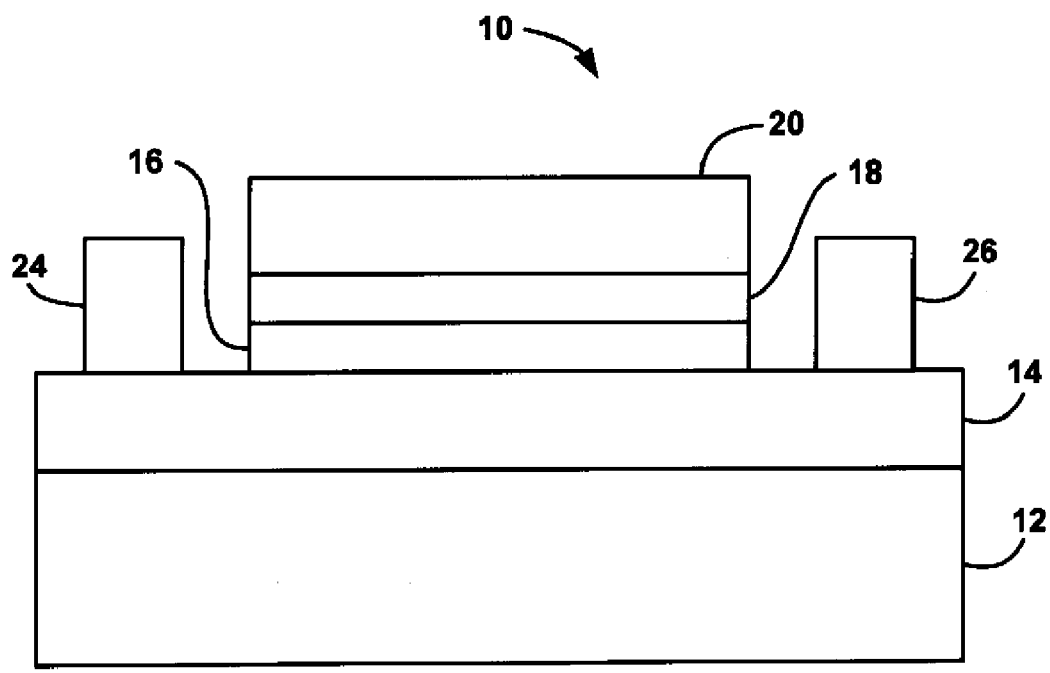
FIG. 2 is a cross-sectional view of an FET semiconductor device employing passivation layers between source and drain terminals, according to an embodiment of the present invention.

FIG. 2 is a cross-sectional view of the semiconductor device 10 including a source terminal 24 and a drain terminal 26. The passivation layers 16, 18 and 20 have been etched by suitable etchants that will remove portions of the passivation layers 16, 18 and 20 to create vias where the source terminal 24 and the drain terminal 26 can be deposited directly on the semiconductor device layers 14. Depositing contacts in this manner for the source terminal 24 and the drain terminal 26 requires high temperature annealing and other fabrication steps that could damage the device layers 14, possibly causing trapping. However, the active portion of the device layers 14 between the source and drain terminals 24 and 26 are protected by the passivation layers 16, 18 and 20. In an alternate embodiment, a portion of the passivation layers 16, 18 and 20 is left between the source and drain terminals 24 and 26 and the device layers 14.

In this embodiment, the source terminal 24 and the drain terminal 26 are shown spaced from the passivation layers 16, 18 and 20. This may be done to prevent interactions between the contact metal and the passivation layers 16, 18 and 20 during the high temperature processing required to create the contacts.

Figure 5:
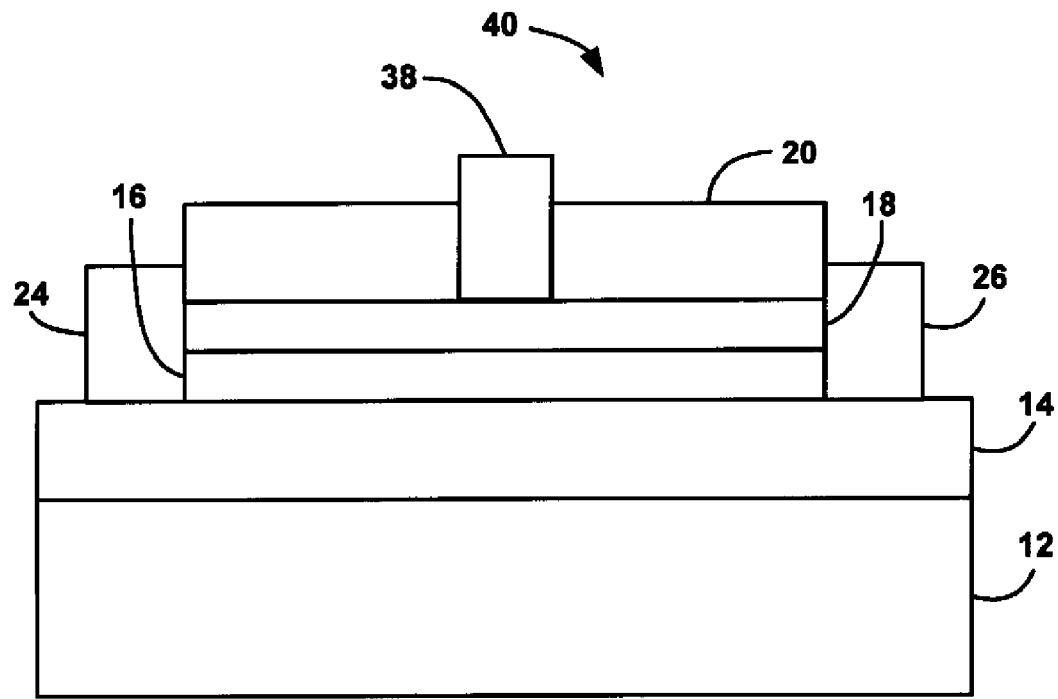
FIG. 5 is a cross-sectional view of an FET semiconductor device showing the source terminal and the drain terminal positioned against a plurality of passivation layers, according to another embodiment of the present invention.

In another embodiment, the passivation material for the layers 16, 18, and 20 that do not interact with the source and drain contact metals during the contact process may be used to eliminate the space between the terminals 24 and 26 and the passivation layers. This embodiment is shown in FIG. 5 for an FET device 40 where the source terminal 24 and the drain terminal 26 are positioned against the passivation layers 16, 18 and 20.

Figure 6:
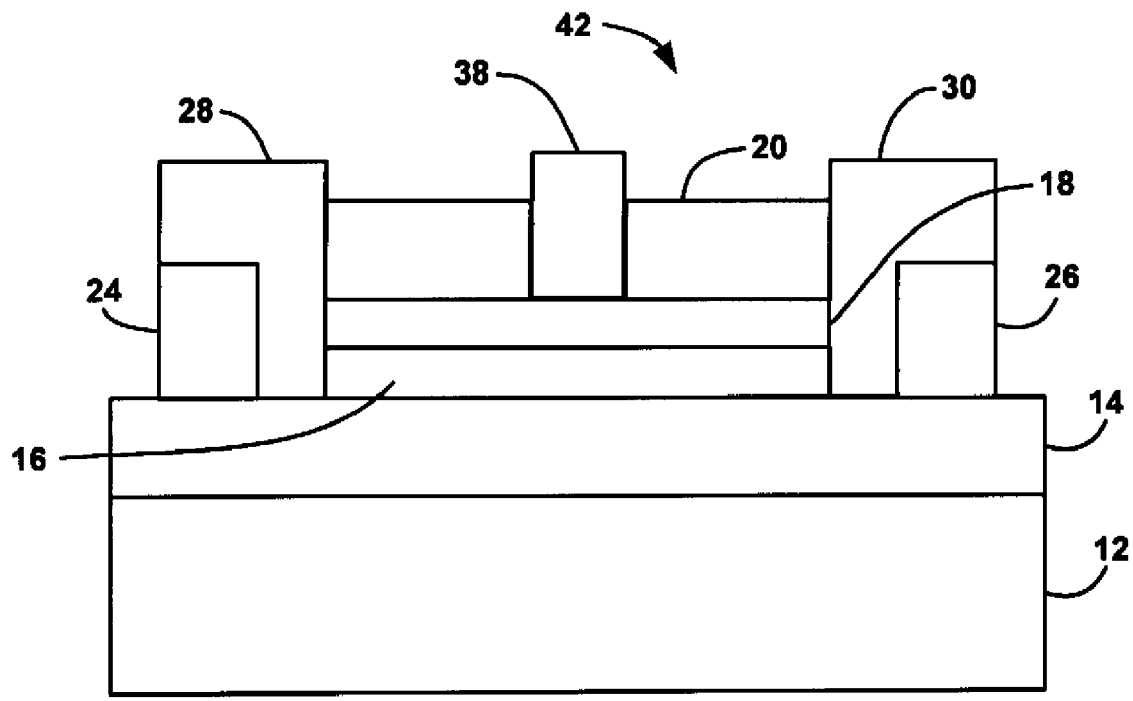
FIG. 6 is a cross-sectional view of an FET semiconductor device showing a metal layer between the source terminal and the passivation layers and the drain terminal and the passivation layers, according to another embodiment of the present invention.

In another embodiment, metal may be deposited in the space between the source terminal 24 and the passivation layers 16, 18 and 20, and the drain terminal 26 and the passivation layers 16, 18 and 20 after the high temperature contacts of the terminals 24 and 26 have been created. This embodiment is shown in FIG. 6 for an FET device 42 where a metal layer 28 is deposited between the source terminal 24 and the passivation layers 16, 18 and 20, and a metal layer 30 is deposited between the drain terminal 26 and the passivation layer 16, 18 and 20.

Figure 7:
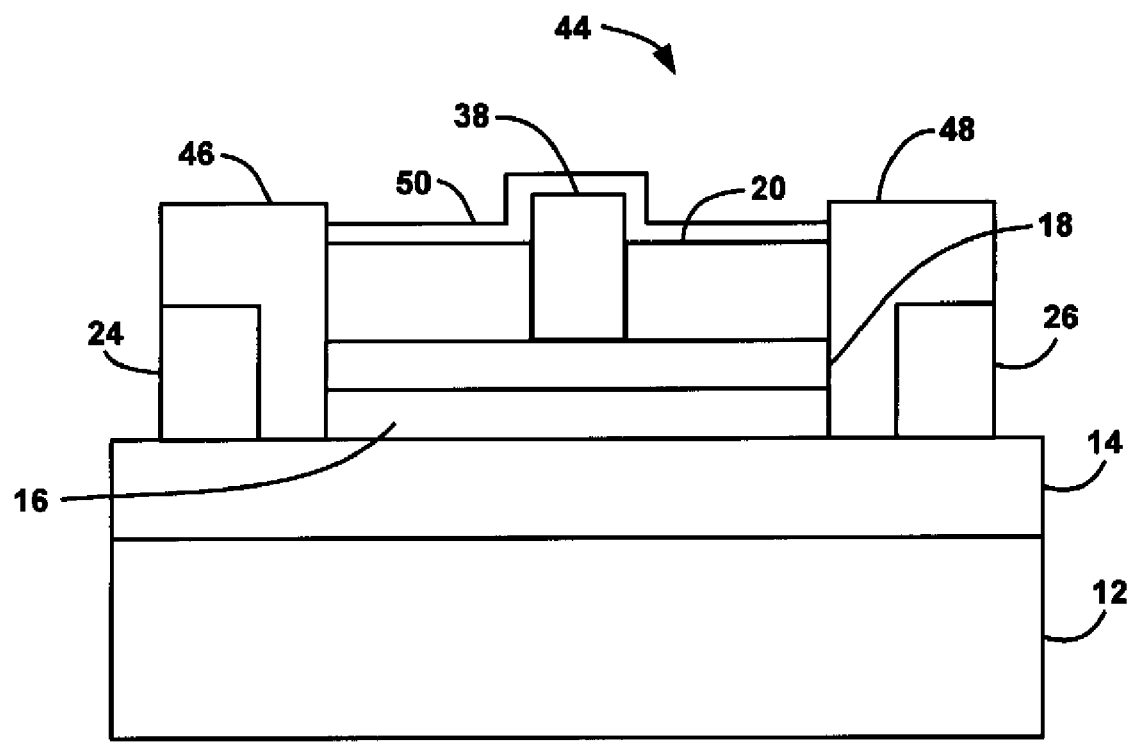
FIG. 7 is a cross-sectional view of an FET semiconductor device showing dielectric material deposited between the source terminal and the passivation layers and the drain terminal and the passivation layers, according to another embodiment of the present invention.

In another embodiment, a dielectric material can be deposited in the space between the source terminal 24 and the passivation layers 16, 18 and 20 and the drain terminal 26 and the passivation layers 16, 18 and 20 after the high temperature contacts of the terminals 24 and 26 have been created. This embodiment is shown in FIG. 7 for an FET device 44 where a dielectric layer 46 is deposited between the source terminal 24 and the passivation layer 16, 18 and 20, and a dielectric layer 48 is deposited between the drain terminal 26 and the passivation layers 16, 18 and 20.

It is desirable that the distance between the gate terminal and the semiconductor device layers 14 be as small as possible to increase device performance. However, it is not desirable to provide the gate terminal directly on the device layers 14 because this can lead to high gate current leakage. Therefore, it is desirable to provide a thin dielectric layer between the gate terminal and the device layers 14.

Figure 3:
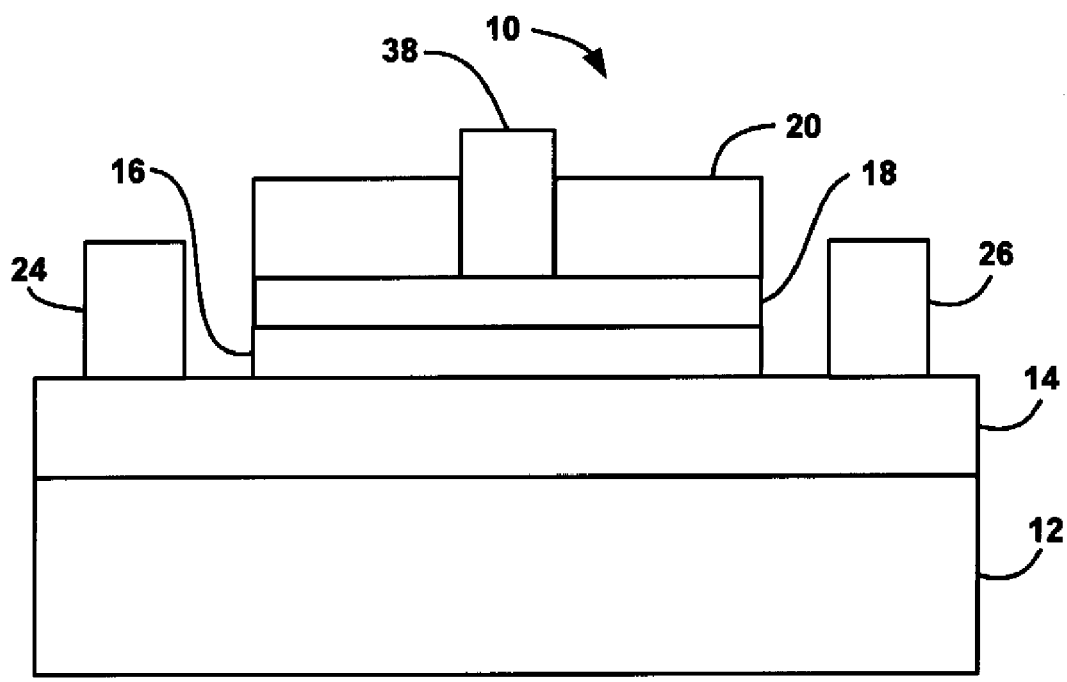
FIG. 3 is a cross-sectional view of an FET semiconductor device showing a passivation layer having been etched down to accommodate a gate terminal, according to an embodiment of the present invention.

FIG. 3 shows an embodiment of the present invention where a suitable mask has been used to etch a via through the third passivation layer 20 to create an opening for a gate terminal 38. In this embodiment, the material of the passivation layer 20 and the passivation layer 18 would be different so that the interface between the layers 18 and 20 creates an etch stop so that the distance between the bottom surface of the gate terminal 38 and the top surface of the device layers 14 can be tightly controlled. In this embodiment, the passivation layers 16 and 18 are made of different materials, but do not need to be, and can be a single thicker layer made of the same material, but different than the passivation layer 20. The etch time required to etch the via in the passivation layer 20 does not need to be tightly controlled because once the etchant used to etch the material of the passivation layer 20 reaches the material of the passivation layer 18, the etching will stop. In other words, instead of relying on time to stop an etch for these types of devices, which was done in the prior art, the present invention stops the etch by using an etchant that only etches the material that is to be removed, and not the material of the underlying layer.

As discussed above, the gate recess for the gate terminal 38 is formed by a low damage etch process that has sufficient selectivity to stop at a specific material interface within the plurality of dielectric layers. Alternately, the gate recess can be formed by more than one etch process that has sufficient selectivity to remove multiple layers within the plurality of dielectric layers 16, 18 and 20.

Thus, the present invention provides three benefits, namely a thick protective layer is provided above the access regions between the source terminal 24 and the gate terminal, and the drain terminal 26 and the gate terminal 38, which reduces dispersion and improves reliability. Also, a thin dielectric layer is provided under the gate terminal 38 that reduces gate current leakage and improves reliability.

Figure 4:
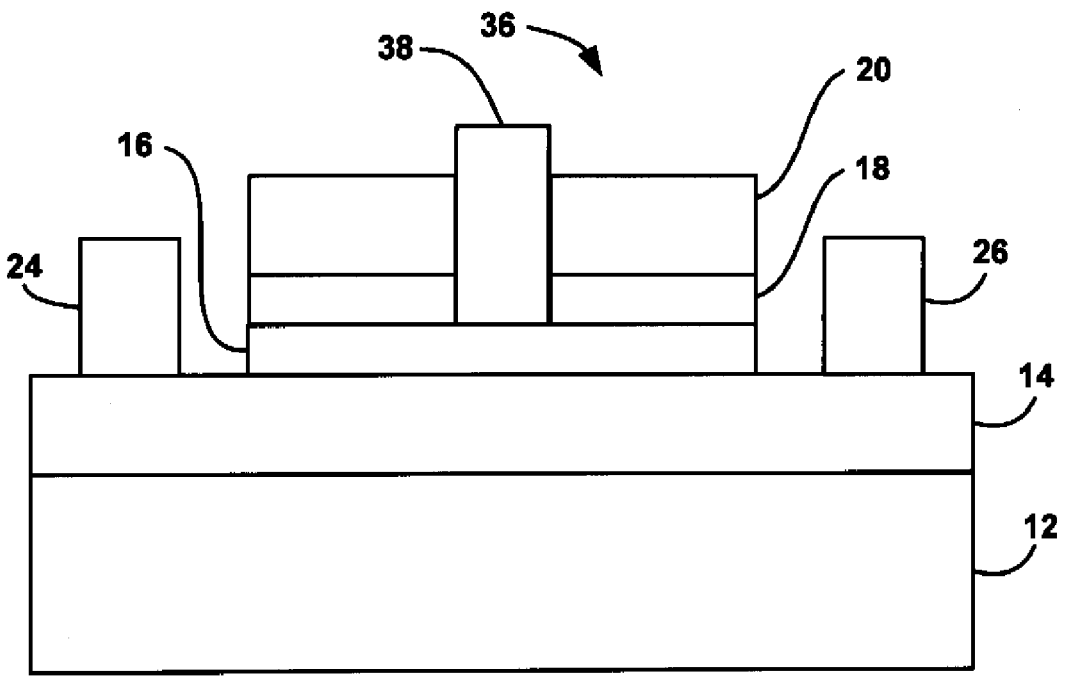
FIG. 4 is a cross-sectional view of an FET semiconductor device showing two passivation layers having been etched down to accommodate a gate terminal, according to another embodiment of the present invention.

FIG. 4 is a cross-sectional view of a device 36, according to another embodiment of the present invention, where a via is formed through the passivation layers 18 and 20 for the gate terminal 38, and where the distance between the gate terminal 38 and the top of the device layers 14 is set by the thickness of the passivation layer 16. The passivation layer 16 can be quite thin, such as 10 Å, so that the gate terminal 38 is very close to the device layers 14. In this embodiment, the material of the second passivation layer 18 and the first passivation layer 16 are different so that the interface therebetween acts as an etch stop in the manner as discussed above. The passivation layers 18 and 20 can be made of the same material or a different material, where if the passivation layers 18 and 20 were made of the same material, a single layer could be used to form the two passivation layers 18 and 20. The passivation layers 16 and 20 can be made of the same material and the passivation layer 18 would be a different material. In this embodiment two selective etches might be used to define the gate recess. The first would stop at the interface between the layers 20 and 18. The second selective etch would be designed to stop at the interface between the layers 16 and 18.

The device fabrication process could include an overall passivation layer deposition that protects the device after the terminals 24, 26 and 38 have been formed. The FET device 44 shown in FIG. 7 also shows such an overall passivation layer 32 in combination with the passivation layers 46 and 48 that protect the entire device 44.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for fabricating a field effect transistor device, said method comprising:
   providing a substrate;
   depositing a plurality of semiconductor device layers on the substrate;
   depositing a plurality of dielectric passivation layers on the semiconductor layers, wherein at least two of the passivation layers are made of a different dielectric material;
   depositing a source terminal on the semiconductor device layers;
   depositing a drain terminal on the semiconductor device layers;
   etching through at least one of the passivation layers to provide a gate terminal recess; and
   depositing a gate terminal within the gate terminal recess so that at least one of the passivation layers still remains between the gate terminal and the semiconductor device layers and so that the thickness of the passivation layers between the source terminal and the gate terminal and the drain terminal and the gate terminal is greater than the thickness of the one or more passivation layers between the gate terminal and the semiconductor device layers so that passivation layers are provided at sides of the gate terminal.

2. The method according to claim 1 wherein depositing the plurality of dielectric passivation layers includes depositing the plurality of dielectric passivation layers before the semiconductor layers are exposed to air and before the source terminal, the drain terminal and the gate terminal are deposited.

3. The method according to claim 1 wherein depositing the plurality of dielectric layers includes depositing the plurality of dielectric layers after the semiconductor device layers have been exposed to air, but before the source terminal, the drain terminal and the gate terminal are deposited.

4. The method according to claim 1 wherein depositing the source terminal and the drain terminal includes forming patterned openings in the plurality of dielectric passivation layers, depositing the source terminal and the drain terminal in the patterned openings so that there is a space between an edge of the source terminal and the plurality of dielectric passivation layers and an edge of the drain terminal and the plurality of dielectric passivation layers.

5. The method according to claim 4 further comprising filling in the space between the edge of the source terminal and the plurality of dielectric passivation layers and the edge of the drain terminal and the plurality of dielectric passivation layers with a passivation layer after a terminal anneal process.

6. The method according to claim 4 further comprising filling in the space between the edge of the source terminal and the plurality of dielectric passivation layers and the edge of the drain terminal and the plurality of dielectric passivation layers with a metal after a terminal anneal process.

7. The method according to claim 1 wherein depositing the source terminal and the drain terminal includes forming patterned openings in the plurality of dielectric passivation layers, depositing the source terminal and the drain terminal in the patterned openings so that there is not a space between an edge of the source terminal and the plurality of dielectric passivation layer and an edge of the drain terminal and the plurality of dielectric passivation layers.

8. The method according to claim 1 wherein forming the gate recess includes forming the gate recess by a low damage etch process that has sufficient selectivity to stop at a specific material interface within the plurality of dielectric passivation layers.

9. The method according to claim 1 wherein forming the gate recess includes forming the gate recess by more than etch process that has sufficient selectivity to remove multiple layers within the plurality of dielectric passivation layers.

10. The method according to claim 1 further comprising depositing a dielectric protection layer over the device after the source terminal, the drain terminal and the gate terminal have been deposited.

11. The method according to claim 1 wherein depositing a source terminal on the semiconductor device layers and depositing a drain terminal on the semiconductor device layers includes depositing the source terminal and the drain terminal directly on the semiconductor device layers.

12. The method according to claim 1 wherein depositing a plurality of dielectric passivation layers includes depositing at least one silicon nitride passivation layer and depositing at least one aluminum nitride passivation layer.

13. The method according to claim 1 wherein the device is a nitride-based device.

14. The method according to claim 1 wherein providing a substrate includes providing a substrate selected from the group consisting of sapphire, SiC, Si, AlN and GaN substrates.

15. The method according to claim 1 wherein the device is selected from the group consisting of HEMT devices, MESFET devices, MOSFET devices, MISFET devices and MODFET devices.

16. The method according to claim 1 wherein depositing a plurality of dielectric passivation layers includes depositing three passivation layers where the thickness of the combination of two of the passivation layers closest to the device layers is thinner than a top passivation layer on the two passivation layers.

17. The method according to claim 16 wherein depositing a gate terminal includes depositing a gate terminal only on a passivation layer closest to the device layers.

18. The method according to claim 16 wherein depositing a gate terminal includes depositing a gate terminal on two passivation layers closest to the device layers.

19. The method according to claim 1 wherein etching through at least one of the passivation layers includes etching through at least one of the passivation layers so that the thickness of the one or more passivation layers between the gate terminal and the device layers is in the range of 5-150 Å.

20. The method according to claim 1 wherein depositing the semiconductor device layers and the passivation layers includes using a process selected from the group consisting of molecular beam epitaxy processes, chemical vapor deposition processes, physical vapor deposition processes and atomic layer deposition processes.

21. A method for fabricating a field effect transistor device, said method comprising:
providing a substrate;
depositing a plurality of semiconductor device layers on the substrate;
depositing a plurality of dielectric passivation layers on the semiconductor layers, wherein at least two of the passivation layers are made of a different dielectric material;
depositing a source terminal on the semiconductor device layers;
depositing a drain terminal on the semiconductor device layers;
etching through at least one of the passivation layers to provide a gate terminal recess; and
depositing a gate terminal within the gate terminal recess so that at least one of the passivation layers still remains between the gate terminal and the semiconductor device layers, wherein depositing the plurality of dielectric passivation layers includes depositing the plurality of dielectric passivation layers before the semiconductor layers are exposed to air and before the source terminal, the drain terminal and the gate terminal are deposited.

22. The method according to claim 21 wherein depositing a source terminal on the semiconductor device layers and depositing a drain terminal on the semiconductor device layers includes depositing the source terminal and the drain terminal directly on the semiconductor device layers.

23. A method for fabricating a field effect transistor device, said method comprising:
providing a substrate;
depositing a plurality of semiconductor device layers on the substrate;
depositing a plurality of dielectric passivation layers on the semiconductor layers, wherein at least two of the passivation layers are made of a different dielectric material;

depositing a source terminal on the semiconductor device layers;
depositing a drain terminal on the semiconductor device layers;
etching through at least one of the passivation layers to provide a gate terminal recess; and
depositing a gate terminal within the gate terminal recess so that at least one of the passivation layers still remains between the gate terminal and the semiconductor device layers, wherein depositing the plurality of dielectric passivation layers includes depositing the plurality of dielectric passivation layers after the semiconductor layers have been exposed to air, but before the source terminal, the drain terminal and the gate terminal are deposited.

24. The method according to claim 23 wherein depositing a source terminal on the semiconductor device layers and depositing a drain terminal on the semiconductor device layers includes depositing the source terminal and the drain terminal directly on the semiconductor device layers.

* * * * *